United States Patent
Uzoh et al.

(10) Patent No.: US 9,893,030 B2
(45) Date of Patent: Feb. 13, 2018

(54) RELIABLE DEVICE ASSEMBLY

(71) Applicant: Invensas Corporation, San Jose, CA (US)

(72) Inventors: Cyprian Emeka Uzoh, San Jose, CA (US); Belgacem Haba, Saratoga, CA (US); Charles G. Woychik, Niskayuna, NY (US); Michael Newman, Fort Collins, CO (US); Terrence Caskey, San Diego, CA (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 15/212,603

(22) Filed: Jul. 18, 2016

(65) Prior Publication Data

US 2016/0329290 A1 Nov. 10, 2016

Related U.S. Application Data (62) Division of application No. 13/924,002, filed on Jun. 21, 2013, now Pat. No. 9,398,700.

(51) Int. Cl.
*H05K 7/00* (2006.01)
*H01L 23/00* (2006.01)
(Continued)

(52) U.S. Cl.
CPC .......... *H01L 24/13* (2013.01); *H01L 23/564* (2013.01); *H01L 24/03* (2013.01); *H01L 24/11* (2013.01);
(Continued)

(58) Field of Classification Search
CPC . H01L 2924/00014; H01L 2924/00012; H01L 2924/01015; H01L 2224/03912;
(Continued)

(56) References Cited

U.S. PATENT DOCUMENTS 5,675,889 A * 10/1997 Acocella .............. B23K 1/0008
228/180.21
6,674,161 B1 * 1/2004 Haba ................... H01L 25/0657
257/296
(Continued)

FOREIGN PATENT DOCUMENTS

| JP | H0266953 A | 3/1990 |
|----|------------|--------|
| JP | H07183304 A | 7/1995 |
| WO | 9827585 A1 | 6/1998 |

OTHER PUBLICATIONS

Partial International Search Report for Appln. No. PCT/US2014/042064 dated Sep. 4, 2014.
(Continued)

*Primary Examiner* — Yuriy Semenenko (57) ABSTRACT

Microelectronic assemblies and methods for making the same are disclosed herein. In one embodiment, a method of forming a microelectronic assembly comprises assembling first and second components to have first major surfaces of the first and second components facing one another and spaced apart from one another by a predetermined spacing, the first component having first and second oppositely-facing major surfaces, a first thickness extending in a first direction between the first and second major surfaces, and a plurality of first metal connection elements at the first major surface, the second component having a plurality of second metal connection elements at the first major surface of the second component; and plating a plurality of metal connector regions each connecting and extending continuously between a respective first connection element and a corresponding second connection element opposite the respective first connection element in the first direction.

2 Claims, 9 Drawing Sheets

(51) Int. Cl.
  *H05K 1/18* (2006.01)
  *H05K 3/30* (2006.01)
  *H01L 25/065* (2006.01)
  *H01L 25/00* (2006.01)
  *H01L 21/56* (2006.01)

(52) U.S. Cl.
  CPC .............. *H01L 24/14* (2013.01); *H01L 24/16* (2013.01); *H01L 24/17* (2013.01); *H01L 24/81* (2013.01); *H01L 24/83* (2013.01); *H01L 24/92* (2013.01); *H01L 25/0652* (2013.01); *H01L 25/0655* (2013.01); *H01L 25/0657* (2013.01); *H01L 25/50* (2013.01); *H05K 1/181* (2013.01); *H05K 3/30* (2013.01); *H01L 21/563* (2013.01); *H01L 24/02* (2013.01); *H01L 24/05* (2013.01); *H01L 24/32* (2013.01); *H01L 2224/02372* (2013.01); *H01L 2224/0345* (2013.01); *H01L 2224/0347* (2013.01); *H01L 2224/03462* (2013.01); *H01L 2224/03464* (2013.01); *H01L 2224/03912* (2013.01); *H01L 2224/03914* (2013.01); *H01L 2224/0401* (2013.01); *H01L 2224/05147* (2013.01); *H01L 2224/05155* (2013.01); *H01L 2224/05557* (2013.01); *H01L 2224/05568* (2013.01); *H01L 2224/05571* (2013.01); *H01L 2224/05609* (2013.01); *H01L 2224/05611* (2013.01); *H01L 2224/05639* (2013.01); *H01L 2224/05644* (2013.01); *H01L 2224/05647* (2013.01); *H01L 2224/05655* (2013.01); *H01L 2224/05657* (2013.01); *H01L 2224/05664* (2013.01); *H01L 2224/10145* (2013.01); *H01L 2224/1146* (2013.01); *H01L 2224/1147* (2013.01); *H01L 2224/11462* (2013.01); *H01L 2224/11464* (2013.01); *H01L 2224/11903* (2013.01); *H01L 2224/1319* (2013.01); *H01L 2224/13024* (2013.01); *H01L 2224/13025* (2013.01); *H01L 2224/13109* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2224/13164* (2013.01); *H01L 2224/14517* (2013.01); *H01L 2224/1601* (2013.01); *H01L 2224/16057* (2013.01); *H01L 2224/16058* (2013.01); *H01L 2224/16104* (2013.01); *H01L 2224/16105* (2013.01); *H01L 2224/16145* (2013.01); *H01L 2224/16146* (2013.01); *H01L 2224/16225* (2013.01); *H01L 2224/16227* (2013.01); *H01L 2224/16503* (2013.01); *H01L 2224/17505* (2013.01); *H01L 2224/17517* (2013.01); *H01L 2224/32145* (2013.01); *H01L 2224/32225* (2013.01); *H01L 2224/73204* (2013.01); *H01L 2224/811* (2013.01); *H01L 2224/81001* (2013.01); *H01L 2224/81007* (2013.01); *H01L 2224/8192* (2013.01); *H01L 2224/81139* (2013.01); *H01L 2224/83104* (2013.01); *H01L 2224/9201* (2013.01); *H01L 2224/9212* (2013.01); *H01L 2225/06513* (2013.01); *H01L 2225/06524* (2013.01); *H01L 2225/06541* (2013.01); *H01L 2924/00014* (2013.01); *Y10T 29/4913* (2015.01)

(58) Field of Classification Search
  CPC ..... H01L 2224/1146; H01L 2224/8192; H01L 2224/9201; H01L 2224/9212; H01L 2924/01074; H01L 2224/0345; H01L 2224/03464
  See application file for complete search history.

(56) References Cited

U.S. PATENT DOCUMENTS

| | | | |
|---|---|---|---|
| 8,319,346 | B2 | 11/2012 | Wakisaka |
| 8,492,891 | B2 | 7/2013 | Lu et al. |
| 2007/0262468 | A1 | 11/2007 | Nasu et al. |
| 2008/0054458 | A1 | 3/2008 | Ozaki |
| 2009/0040731 | A1* | 2/2009 | Jin .................... H01L 23/02 361/711 |
| 2009/0115047 | A1 | 5/2009 | Haba et al. |
| 2011/0233787 | A1 | 9/2011 | Wakisaka |
| 2011/0260317 | A1 | 10/2011 | Lu et al. |
| 2011/0309481 | A1* | 12/2011 | Huang .................. H01L 23/552 257/659 |
| 2012/0104603 | A1* | 5/2012 | Kumbhat ................ H01L 24/81 257/737 |
| 2012/0146066 | A1* | 6/2012 | Tischler ................ H01L 27/156 257/89 |
| 2012/0199981 | A1* | 8/2012 | Jeong ................... H01L 23/481 257/774 |
| 2012/0315753 | A1* | 12/2012 | Farooq ............. H01L 21/76898 438/653 |

OTHER PUBLICATIONS

International Search Report for Appln. No. PCT/2014/042064 dated Nov. 12, 2014.
International Preliminary Report on Patentability, Ch. I, for Appln. No. PCT/US2014/042064 dated Dec. 22, 2015.

* cited by examiner

RELIABLE DEVICE ASSEMBLY

CROSS-REFERENCE TO RELATED APPLICATIONS

The present application is a divisional of U.S. patent application Ser. No. 13/924,002, filed Jun. 21, 2013, the disclosure of which is incorporated herein by reference in its entirety.

FIELD OF THE INVENTION

The present application describes structures such as those which can be incorporated into a microelectronic assembly which may include an unpackaged semiconductor die or packaged semiconductor die, as well as methods for making such structures.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically between about 0.005 mm and about 0.8 mm in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

An interposer can be provided as an interconnection element having contacts and top and bottom surfaces thereof electrically connected with one or more packaged or unpackaged semiconductor dies at one of the top or bottom surface thereof, and electrically connected with another component at the other one of the top or bottom surfaces. The other component may in some cases be a package substrate which in turn may be electrically connected with another component which may be or may include a circuit panel.

Despite all of the above-described advances in the art, still further improvements in microelectronics assemblies, the individual components thereof, such as interposers and microelectronics elements, and methods of making the same would be desirable.

BRIEF SUMMARY OF THE INVENTION

Microelectronic assemblies and methods for making the same are disclosed herein. In one embodiment, a method of forming a microelectronic assembly comprises assembling first and second components to have first major surfaces of the first and second components facing one another and spaced apart from one another by a predetermined spacing. The first component having first and second oppositely facing major surfaces, and having a first thickness extending in a first direction between the first and second major surfaces. The first component includes a plurality of first metal connection elements at the first major surface, and the second component having a plurality of second metal connection elements at the first major surface of the second component. The method includes plating a plurality of metal connector regions each connecting and extending continuously between a respective first connection element and a corresponding second connection element opposite the respective first connection element in the first direction.

In one embodiment, prior to assembling the first and second components, the method further comprises forming the first metal connection elements. Forming the first metal connection elements can include forming at least one of first metal vias extending in the first direction of the first thickness between first and second major surfaces of the first component, or first metal pads at the first major surface of the first component; and plating first plated metal regions above the at least one of first metal vias or first metal pads, the first plated metal regions extending the first direction at least above the first major surface of the first component, wherein each plated metal connector region connecting and extending continuously in the first direction between a respective first surface of the first plated metal region and a corresponding second surface of the second metal connection element opposite the respective first plated metal region.

In one embodiment, prior to assembling the first and second components, the method further comprises separately forming the second metal connection elements. Forming second metal connection elements can include forming at least one of second metal vias extending in a direction of thickness of the second component between first and second major surfaces of the second component, or second metal pads at the first major surface of the second component; and plating second plated metal regions above the at least one of second metal vias or second metal pads, the second plated metal regions extending at least above the first major surface of the second component, wherein each plated metal connector region connecting and extending continuously in the first direction between a respective first surface of the first plated metal region and a corresponding second surface of the second plated metal region opposite the respective first plated metal region.

In one embodiment, forming the first and second metal connection elements further comprise forming a first seed layer overlying the first major surface of the first component and electrically connected to the at least one of the first metal vias or first metal pads, wherein the first seed layer electrically connects each first plated metal region to a corresponding first metal via or first metal pad; and forming a second seed layer overlying the first major surface of the second component and electrically connected to the at least one of the second metal vias or second metal pads, wherein the second seed layer electrically connects each second plated metal region to a corresponding second metal via or second metal pad.

In one embodiment, plating the first and second plated metal regions further comprises: separately forming patterned dielectric layers overlying each of the first and second layers, the patterned dielectric layers having openings which expose portions of the first and second seed layers that overlie, respectively, each first metal via or first metal pad, and each second metal via or second metal pad; and forming the first and second plated metal regions in the openings.

In one embodiment, prior to assembling the first and second components, the method further comprises removing the patterned dielectric layers after formation of the first and second plated metal regions; and separately forming second dielectric layers overlying, respectively, the first and second seed layers and sidewall surfaces of the first and second plated metal regions, wherein the first and second surfaces of each first and second plated metal region are exposed.

In one embodiment, after assembling the first and second components and plating of the metal connector regions, the method further comprises removing the second dielectric layers; and removing portions of the first and second seed layers to electrically separate adjacent first and second conductive connection elements.

In one embodiment, prior to or after removing the second dielectric layers, the method further comprises forming a plurality of barrier regions overlying the sidewalls of at least one of the metal connector regions, the first plated metal regions, or the second plated metal regions.

In one embodiment, prior to assembling the first and second components, separately forming the first and second metal connection elements. The first metal connection elements can be formed by forming at least one of first metal vias extending in the first direction of the first thickness between first and second major surfaces of the first component, or first metal pads at the first major surface of the first component. The second metal connection elements can be formed by forming at least one of second metal vias extending in a direction of thickness of the second component between first and second major surfaces of the second component, or second metal pads at the first major surface of the second component.

In one embodiment, prior to assembling the first and second components, the method further comprises forming a first seed layer overlying the first major surface of the first component and electrically connected to the at least one of the first metal vias or first metal pads, wherein the first seed layer electrically connects each first plated metal region to a corresponding first metal via or first metal pad; and forming a second seed layer overlying the first major surface of the second component and electrically connected to the at least one of the second metal vias or second metal pads, wherein the second seed layer electrically connects each second plated metal region to a corresponding second metal via or second metal pad.

In one embodiment, prior to assembling the first and second components, the method further comprises separately forming patterned dielectric layers overlying each of the first and second layers, the patterned dielectric layers exposing portions of the first and second seed layers that overlie, respectively, each first metal via or first metal pad, and each second metal via or second metal pad.

In one embodiment, plating the metal connector regions further comprises plating the metal connector region between corresponds exposed portions of the first and second seed layers.

In one embodiment, the method further comprises removing portions of the first and second seed layers to electrically separate adjacent first and second metal connection elements.

In one embodiment, prior to or after removing portions of the first and second seed layers, the method further comprises forming a plurality of barrier regions overlying sidewalls of the metal connector regions.

In one embodiment, assembling the first and second components further comprises forming an element disposed between the first major surfaces of the first and second microelectronic elements, the element bonding the first and second components with one another, wherein the predetermined spacing includes a thickness of the element.

In one embodiment, the first and second components are microelectric elements.

In one embodiment, the first component is one or more microelectronic elements and the second component is a printed circuit board (PCB).

In one embodiment, at least some corresponding first and second metal connection elements do not share a common axis.

In one embodiment, at least some first and second surfaces of the first metal connection elements and the respective second metal connection elements connected thereto are not parallel to a common plane.

In one embodiment, a microelectronic assembly comprises a first component having first and second oppositely facing major surfaces, and having a first thickness extending in a first direction between the first and second major surfaces. The first component including and a plurality of first metal connection elements projecting in the first direction above the first major surface, each first metal connection element having a first plated metal region extending in the first direction above the first major surface. The microelectronic assembly includes a second component having a first major surface and a plurality of second metal connection elements at the first major surface of the second component, the first major surfaces of the first and second components facing one another. The microelectronic assembly includes a plurality of plated metal connector regions each connecting and extending continuously in the first direction between a respective first surface of the plated metal region of a first metal connection element and a corresponding second surface of a second metal connection element opposite the respective first metal connection element.

In one embodiment, at least some of the second metal connection elements further comprise a second plated metal region extending above the first major surface of the second component, the second plated metal region including the second surface of the second metal connection element, wherein the plated metal connector region extends continuously in the first direction between a respective first surface of the first plated metal region and the second surface of the second plated meta region.

In one embodiment, a microelectronic assembly comprises a first component having first and second oppositely facing major surfaces, and having a first thickness extending in a first direction between the first and second major surfaces. The first component includes a plurality of first metal connection elements at the first major surface. The microelectronic assembly includes a second component having a first major surface and a plurality of second metal connection elements at the first major surface of the second component, the first major surfaces of the first and second components facing one another. The microelectronic assembly includes a plurality of plated metal connector regions each connecting and extending continuously in the first direction between a respective first metal connection element and a corresponding second metal connection element opposite the respective first metal connection element. The microelectronic assembly includes a plurality of barrier regions overlying at least some of the plated metal connector regions, each barrier region chemically insulating a plated metal connector region.

In one embodiment, the first component and the plated metal connector regions are non-electrical components for mechanical support.

In one embodiment, a microelectronic assembly comprises a first component having first and second oppositely facing major surfaces, and having a first thickness extending in a first direction between the first and second major surfaces. The first component includes a plurality of first metal connection elements projecting in the first direction above the first major surface. Each first metal connection element has a first plated metal region extending in the first direction above the first major surface. The microelectronic assembly includes a second component having a first major surface and a plurality of second metal connection elements at the first major surface of the second component, where the first major surfaces of the first and second components facing one another. The microelectronic assembly includes a plurality of plated metal connector regions each connecting and extending continuously in the first direction between a respective first surface of the plated metal region of a first metal connection element and a corresponding second surface of a second metal connection element opposite the respective first metal connection element.

In one embodiment, the first major surfaces of the first and second components are spaced apart from one another by a predetermined spacing.

In one embodiment, each metal connector region does not fully cover a sidewall of the first plated metal region.

In one embodiment, the plated metal connector region has a lower impurity level than the first plated metal region.

In one embodiment, the microelectronic assembly further comprises a first intermetallic region formed at a boundary between the first plated metal region and the plated metal connector region, the first intermetallic region having a thickness in the first direction of less than about 200 nanometers.

In one embodiment, each metal connector region includes a portion extending in a lateral direction outward beyond edges of the first and second surfaces of the first and second metal connection elements.

In one embodiment, at least some corresponding first and second metal connection elements do not share a common axis.

In one embodiment, at least some first and second surfaces of the first plated metal regions and the respective second metal connection elements connected thereto are not parallel to a common plane.

In one embodiment, at least some of the first plated metal regions extend below the first major surface of the first component.

In one embodiment, the first plated metal region overlies the first surface of a via extending in a direction towards the second surface.

In one embodiment, at least some of the first metal connection elements further comprise a contact at the first major surface of the first component, wherein a first plated metal region extends in the first direction above a surface of the contact.

In one embodiment, at least some of the first metal connection elements further comprise a first seed layer overlying the surface of the contact, wherein the first plated metal region overlies the first seed layer.

In one embodiment, the first plated metal region overlies the first surface of the contact.

In one embodiment, at least some of the first metal connection elements further comprise a via extending in the first direction of the first thickness between the first and second major surfaces of the first component, wherein a first plated metal region of said plurality of first metal regions extends in the first direction above a surface of the via.

In one embodiment, at least some of the first metal connection elements further comprise a first seed layer overlying the surface of the via, wherein the first plated metal region overlies the first seed layer.

In one embodiment, at least some of the second metal connection elements further comprise a second plated metal region extending above the first major surface of the second component, the second plated metal region including the second surface of the second metal connection element, wherein the plated metal connector region extends continuously in the first direction between a respective first surface of the first plated metal region and the second surface of the second plated meta region.

In one embodiment, at least some of the second metal connection elements further comprise a contact at the first major surface of the second component.

In one embodiment, at least some of the second metal connection elements further comprise a via extending in the first direction of a second thickness of the second component.

In one embodiment, the first and second metal connection elements, the first plated metal regions, and the plated metal connector regions can, independently, include one or more of copper (Cu), nickel (Ni), cobalt (Co), nickel phosphorus (NiP), cobalt phosphorus (CoP), cobalt tungsten (CoW), cobalt tungsten phosphorus (CoWP), or alloys thereof.

In one embodiment, the microelectronic assembly further comprises a dielectric adhesive element disposed between the first major surfaces of the first and second components, the dielectric adhesive element bonding the first and second components with one another.

In one embodiment, the microelectronic assembly further comprises a polymeric element disposed between the first major surfaces of the first and second components, wherein the predetermined spacing includes a thickness of the polymeric element.

In one embodiment, the first component is a microelectronic element.

In one embodiment, the second component is a microelectronic element.

In one embodiment, the second component is an interposer.

In one embodiment, microelectronic assembly further comprises a first redistribution structure overlying the second major surface of the first component, the first redistribution structure electrically connected to at least some of the plurality of first connection elements; and a second redistribution structure overlying a second major surface of the second component opposite the first major surface of the second component, the second redistribution structure electrically connected to at least some of the plurality of second connection elements.

In one embodiment, a microelectronic assembly comprises a first component having first and second oppositely facing major surfaces, and having a first thickness extending in a first direction between the first and second major surfaces. The first component includes a plurality of first metal connection elements at the first major surface. The microelectronic assembly includes a second component having a first major surface and a plurality of second metal connection elements at the first major surface of the second component, the first major surfaces of the first and second components facing one another. The microelectronic assembly includes a plurality of plated metal connector regions each connecting and extending continuously in the first direction between a respective first metal connection element and a corresponding second metal connection element opposite the respective first metal connection element. The microelectronic assembly includes a plurality of barrier regions overlying at least some of the plated metal connector regions, each barrier region chemically insulating a plated metal connector region.

In one embodiment, the first major surfaces of the first and second components are spaced apart from one another by a predetermined spacing.

In one embodiment, each plated metal connector region includes a portion extending in a lateral direction outward beyond edge surfaces of the first and second connection elements.

In one embodiment, the microelectronic assembly further comprises a dielectric adhesive element disposed between the first major surfaces of the first and second components and overlying the plurality of barrier regions, the dielectric adhesive element bonding the first and second microelectronic elements with one another.

In one embodiment, the microelectronic assembly further comprises a polymeric element disposed between the first major surfaces of the first and second compounds and overlying the plurality of barrier regions, wherein the predetermined spacing includes a thickness of the polymeric element.

BRIEF DESCRIPTION OF THE DRAWINGS

FIG. 1-1 depicts a side schematic view of a microelectronic assembly in accordance with some embodiments of the invention.

FIG. 1-2 depicts a side schematic view of corresponding first and second metal connection elements in accordance with some embodiments of the invention.

FIG. 1-3 depicts a side schematic view of corresponding first and second metal connection elements in accordance with some embodiments of the invention.

FIG. 1-4 depicts a side schematic view of a microelectronic assembly in accordance with some embodiments of the invention.

FIG. 1-5 depicts a side schematic view of a microelectronic assembly in accordance with some embodiments of the invention.

FIG. 1-6 depicts a side schematic view of a microelectronic assembly in accordance with some embodiments of the invention.

FIGS. 3-1 through 3-6 depict fabrication steps for a microelectronic assembly in accordance with some embodiments of the invention.

FIGS. 4-1 through 4-4 depict fabrication steps for a microelectronic assembly in accordance with some embodiments of the invention.

DETAILED DESCRIPTION

The present invention will be described in more detail below.

All ranges recited herein include the endpoints, including those that recite a range "between" two values. Terms such as "about," "generally," "substantially," and the like are to be construed as modifying a term or value such that it is not an absolute, but does not read on the prior art. Such terms will be defined by the circumstances and the terms that they modify as those terms are understood by those of skill in the art. This includes, at very least, the degree of expected experimental error, technique error and instrument error for a given technique used to measure a value.

It should be further understood that a description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.3, 3, 4, 5, 5.7 and 6. This applies regardless of the breadth of the range.

As used in this disclosure with reference to a substrate, a statement that an electrically conductive element is at a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate.

FIGS. 1-1 through 1-4 depict microelectronic assemblies in accordance with some embodiments of the invention. The various embodiments of the microelectronic assemblies disclosed herein may be utilized alone, or combination.

Figure 11:
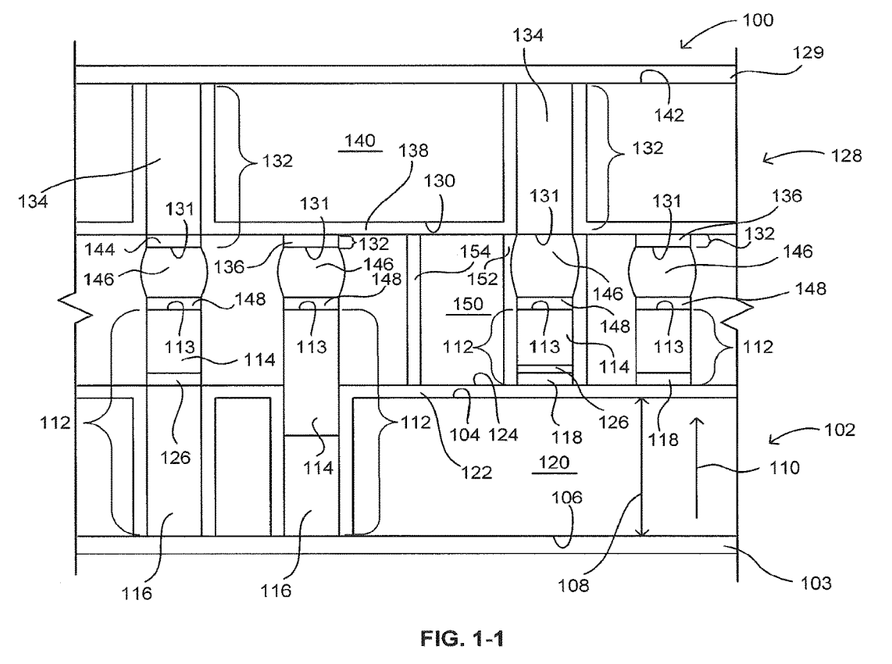

FIG. 1-1 depicts a side schematic view of a microelectronic assembly 100 in accordance with some embodiments of the invention. The microelectronic assembly 100 includes a first component 102. The first component may have a first major surface 104 and an oppositely facing second major surface 106. A first thickness 108 can extend in a first direction 110 between the first and second major surfaces 104, 106. The first component 102 can be one or more components, such any one or more electrical and/or non-electrical components. Non-electrical components, for example, may include those components used for mechanical support and/or thermal management. Exemplary first components 102 can include any one or more of a microelectronic element, such as a semiconductor die, packaged semiconductor chip, or the like, an interposer, a substrate, such as a printed circuit board (PCB), or the like.

The first component 102 may include a plurality of first metal connection elements 112 projecting in the first direction 110 above the first major surface 104. Each first metal connection element 112 can include a first plated metal region 114 extending in the first direction 110 above the first major surface 104. In one embodiment, at least some of the first metal connection elements 112 include first plated metal regions 114 extending above the first major surface 104. In one embodiment, at least some of the first metal connection elements 112 include first plated metal regions 114 extending above and below the first major surface 104. The first plate metal regions 114 may include one or more metals selected from copper (Cu), nickel (Ni), gold (Au), palladium (Pd), indium (In), tin (Sn), silver (Ag), or alloys thereof.

Each first metal connection element 112 may include a conductive element used to electrically connect one element of the first component with another element, or with elements of adjacent components in the microelectronic assembly 100. Alternatively, or in combination, each first metal connection element 112 may provide mechanical support and/or thermal management. Exemplary conductive elements may include vias, traces, pads, surfaces, recessed surfaces, pillars, fins, or other suitable elements for making electrical connections and/or providing mechanical support and/or for thermal management. As illustrated in FIG. 1-1, the first metal connection elements 112 include vias 116 or contact 118.

The vias 116 may extend in the first direction 108 between the first and second major surfaces 104, 106. In one embodiment, at least some first metal connection elements 112 include vias 116 extending in the first direction 108 from the second major surface 106 to the first major surface 104. In one embodiment, at least some first metal connection elements include vias 116 extending between the first and second major surfaces 104, 106. For example, the vias 116 may extend from the second major surface 106 to a level below the first major surface 104. The conductive elements of the first metal connection elements 112, such as the vias 116 or the contacts 118 can include one or more metals selected from copper (Cu), nickel (Ni), cobalt (Co), tungsten (W), nickel phosphorus (NiP), cobalt tungsten (CoW), gold (Au), palladium (Pd), indium (In), tin (Sn), silver (Ag), or alloys thereof.

Optionally, a barrier layer 122 may be utilized to electrically and/or chemically isolate the vias 116 from a region 120 of the first component 102. As used herein, a barrier region provides "chemical isolation" if it prevents short-term and/or long-term deleterious diffusion of ions, such as copper (Cu) across the barrier region at temperatures at which the structure will encounter during subsequent manufacturing processes and during operation or exposure of the component to the surrounding environment in which the component is expected to operate or withstand when not operating. The region 120 may include one or more dielectric, conducting, or semiconducting materials. The region 120 may extend in the first direction 110 between the first and second major surfaces 104, 106. The barrier layer 122 may be a single layer or multiple layers. For example, the barrier layer 122 may include a dielectric layer to electrically isolate the vias 116 from the region 120, and another layer to chemical isolate the vias 116 from the region 120. Exemplary barrier layer materials may include one or more materials selected from silicon dioxide ($SiO_2$), silicon carbide (SiC), silicon oxynitride (SiON), polymeric materials or the like. In one embodiment, the barrier layer 122 may overlie the first major surface 104. For example, the barrier layer 122 may be a dielectric layer of a redistribution structure (RDL), back end of line (BEOL) structure, or the like, which may be overlying the first major surface 104.

The contacts 118 may be disposed at the first major surface 104. In one embodiment, the contacts 118 may be electrically and/or chemically isolated from the region 120 by the barrier layer 122. For example, a contact 118 can be disposed at a first surface 124 of the barrier layer 122. Exemplary contacts 118 include one or more of pads, traces, or the like. The contacts 118 can be electrically connected to one or more conduct elements at the second major surface 106 and/or to microelectronic elements, such as active or passive devices include in the first component 102.

The first metal connection elements 112 can include an optional first seed layer 126, which may electrically connect vias 116 and/or contacts 118 with the first plated metal regions 114. The first seed layer 126 typically includes a relatively thin layer of metal and/or a conductive compound of a metal which typically can be deposited by physical and/or vapor depositions or by electroless aqueous deposition or by combination of two or more such methods. In one exemplary embodiment, the first seed layer 126 may include copper (Cu) or nickel (Ni). The first seed layer 126 may overlie a surface of the vias 116 or contacts 118. The first plated metal regions 114 may overlie the first seed layer 126. In one embodiment, at least some of the first metal connection elements 112 may include the first seed layer 126 when the first plated metal region 114 includes Cu. In another embodiment, at least some of the first metal connection elements 112 may exclude the first seed layer 126 when the first plated metal region 114 includes one or more of Ni, NiP, CoW, or tin alloy.

The first component 102 may include a first redistribution structure 103 overlying the second major surface 106 of the first component 102. The first redistribution structure 103 may be one or more RDL and/or BEOL structures. The first redistribution structure 103 can be electrically connected to at least some of the plurality of first connection elements 112.

The microelectronic assembly 100 includes a second component 128. The second component 128 having a first major surface 130. The first major surfaces 104 and 130 of the first and second components 102, 128 facing one another and spaced apart from one another by a predetermined spacing. The predetermined spacing may range from about 5 microns to about 500 microns. In some embodiments, the predetermined spacing may be less than about 200 microns. The second component 128 can include any embodiments and/or permutations thereof as described for the first components 102. Exemplary combinations of the first and second components 102, 128 can include package on package (PoP), or the like. For example, in one embodiment, the first component 102 can be one or more microelectronic elements and the second component 128 can be a printed circuit board (PCB). For example, in one embodiment, the first and second components 102, 128 can be microelectronic elements.

The second component 128 includes a plurality of second metal connection elements 132. In some embodiments, as discussed further below with respect to FIGS. 1-4 through 1-6, at least some of the second metal connection elements 132 may be constructed in a like manner as the first metal connection elements 112 discussed above. However, as illustrated in embodiments of FIG. 1-1, the second metal connection elements 132 differ from the first metal connection elements 112 at least in that the second metal connection elements 132 do not include a plated metal region, such as the first plated metal region 114.

The second metal connection elements 132 can be disposed at the first surface 130. Each second metal connection elements 132 may include a conductive element used to electrically connect one element of the second component with another element, or with elements of adjacent components in the microelectronic assembly 100. The conductive elements of the second metal connection elements 132 can include any embodiments and/or permutations as described for the conductive elements of the first meal connection elements 112. As illustrated in FIG. 1-1, the second metal connection elements 132 include vias 134 or contacts 136. The vias 134 and contacts 136 can have substantially similar embodiments as the vias 116 and contacts 118 discussed above.

Optionally, a barrier layer 138 may be utilized to electrically and/or chemically isolate the vias 134 from a region 140 of the second component 140. The region 140 may include one or more of dielectric, conducting, or semiconducting materials. The region 140 may extend in the first direction 110 between the first and second major surfaces 130, 142. The barrier layer 138 may be constructed in a like manner as the barrier layer 122 discussed above. In one embodiment, the barrier layer 138 may overlie the first major surface 130. For example, the barrier layer 138 may be a dielectric layer of a redistribution structure (RDL), back end of line (BEOL) structure, or the like, which may be overlying the first major surface 140.

The second metal connection elements 132 can include an optional second seed layer 144, which may electrically connect vias 134 or contacts 136 with plated metal connector regions 146. Each plated metal connector regions 146 connects and extends continuously in the first direction 110 between a respective first surface 113 of a first plated metal region 114 of a first metal connection element 112 and a corresponding second surface 131 of a second metal connection element 132 opposite the respective first metal connection element 112. The plated metal connector regions 146 are further discussed below. The second seed layer 144 may overlie a surface of via 134 or contact 136. The plated metal connector region 146 may overlie the second seed layer 144. In one embodiment, at least some of the second metal connection elements 132 may include the second seed layer 144 when the plated metal connector regions 146 include Cu. In another embodiment, at least some of the second metal connection elements 132 may exclude the second seed layer 144 when the plated metal connector region 146 includes one or more of Ni, NiP, CoW, or tin alloy.

The second component 128 may include a second redistribution structure 129 overlying the second major surface 142 of the second component 128. The second redistribution structure 129 may be one or more RDL and/or BEOL structures. The second redistribution structure 129 can be electrically connected to at least some of the plurality of second connection elements 128.

The microelectronic assembly 100 includes a plurality of plated metal connector regions 146. Each plated metal connector region 146 may extend between corresponding first and second metal connection elements 112, 132. The plate metal connector regions 146 can include a portion extending in a lateral direction outward beyond the edges of the first and second surfaces 113, 131 of the first and second metal connection elements 112, 132. The plated metal connector regions 146 may not fully cover the side walls of corresponding first plated metal regions 114. For example, the plated metal connector regions 146 may be of sufficient quality as plated, such that none or low reflow temperatures are necessary to improve the quality of the plated metal connector regions 146 thus limiting flow of the plated metal connector regions 146 onto the sidewalls of the first plated metal region 114. In one embodiment, at least some of the plated metal connector regions 146 have a lower impurity level than that of the first plated metal regions 114. Reasons for at least some of the plated metal connector regions 146 having a lower impurity level are discussed below with respect to methods of fabricated a microelectronic assembly.

First intermetallic regions 148 can be formed between respective first plated metal regions 114 and plated metal connector regions 146. For example, each first intermetallic region 148 can be formed by interdiffusion of at least one metal of the respective first plated metal regions 114 and another metal of the plated metal connector regions 146 at an interface thereof. The first intermetallic regions 148 may have a brittle structure. Therefore, it may be desirable to limit formation of the first intermetallic regions 148. The first intermetallic regions 148 can have a thickness in the first direction 110 less than about 200 nanometers (nm). In some embodiments, no intermetallic region 148 may form. For example, intermetallic regions 148 may not form when plating nickel (Ni) on copper (Cu), or the opposite.

The microelectronic assembly 100 includes a region 150 extending between the first major surfaces 104, 130 of the first and second components 102, 128. The region 150 may surround at least some of the first metal connection elements 112 and plated metal connector regions 146. In one embodiment, at least some of the first metal connection elements 112 and/or plated metal connector regions 146 can be separated from the region 150 by a barrier region 152. The barrier region 152 may electrically and may chemically isolate the first metal connection elements 112 and/or plated metal connector regions 146 from the region 150. The region 150 may include air, vacuum, or one or more materials, such as dielectric materials or materials suitable for underfill. The barrier region 152 may include one or more materials, such as $SiO_2$, SiC, SiON, or polymeric materials, and may typically be formed of one or more metals or electrically conductive compounds of metals. In one embodiment, the barrier region 152 may provide corrosion protection for the connector regions 146 and/or first and second connection elements 112, 132. In some embodiments, a plurality of elements 154 may extend through the region between the first major surfaces 104, 130. The elements 154 can include a dielectric adhesive or polymeric material. The predetermined spacing between the first major surfaces 104, 130 may include the thickness of the elements 154. The elements 154 may bond the first and second components 102, 128 to one another as discussed in the methods herein.

Figure 12:
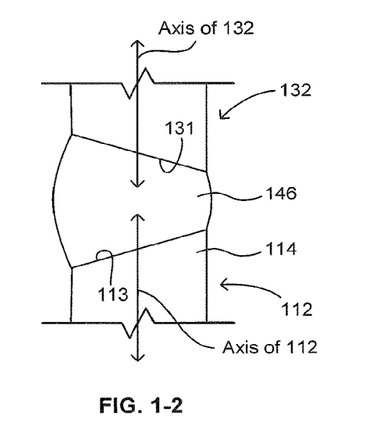
Figure 13:
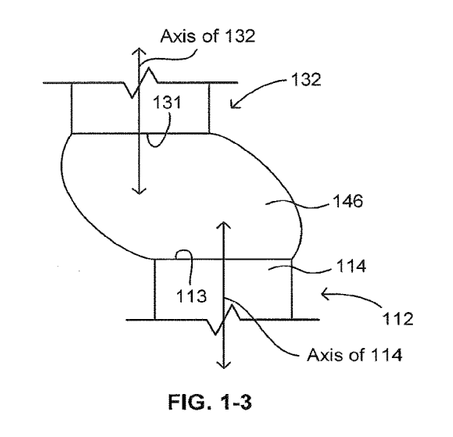

FIGS. 1-2 through 1-3 depict corresponding first and second metal connection elements 112, 132 in accordance with some embodiments of the invention. In one exemplary embodiment illustrated in FIG. 1-2, at least some corresponding first and second surfaces 113, 131 of corresponding first and second metal connection elements 112, 132 are not parallel to a common plane. In one exemplary embodiment illustrated in FIG. 1-3, at least some corresponding first and second metal connection elements 112, 132 do not share a common axis. As used herein with respect to a conductive element such as, for example, the plated metal regions 114 and/or metal connection elements 112, an "axis" thereof means a median of such element in a first and second direction, the first and second directions being parallel to the first major surface of the first component and being orthogonal to one another. In one example, adjacent surfaces 113, 131 of first and second connection elements 112, 132 may be other than parallel surfaces such that some portion of surface 113 may be closer to or farther away from the corresponding surface 131 to which it is connected through a plated metal connector region 146 than another portion of such surface 113. Despite non-parallel surfaces (FIG. 1-2) and/or offset axes (FIG. 1-3), the plated metal connector region 146 can be formed between first and second surfaces 113, 131 of corresponding first and second metal connection elements 112, 132. The exemplary embodiments depicted in FIGS. 1-2 and 1-3 can be applied to any embodiments of a microelectronic assembly disclosed herein.

FIG. 1-4 depicts a microelectronic assembly 160 in accordance with a variation of the above-described embodiment (FIGS. 1-1 through 1-3) where elements with the same reference numbers denote the same structures. In this variation, the microelectronic assembly 160 can vary from the microelectronic assembly 100 in the composition of the second metal connection elements 132. As illustrated in FIG. 1-4, the second metal connection elements 132 further include second plated metal regions 162 extending above the first major surface 130 of the second component 128. The second plated metal regions 162 can be constructed in a like manner as the first plated metal regions 114 discussed above. In one embodiment, at least some of the second plated metal regions 162 can overlie vias 134 or contacts 136. In one embodiment, at least some of the second plated metal regions 162 can overlie the second seed layers 144.

Figure 14:
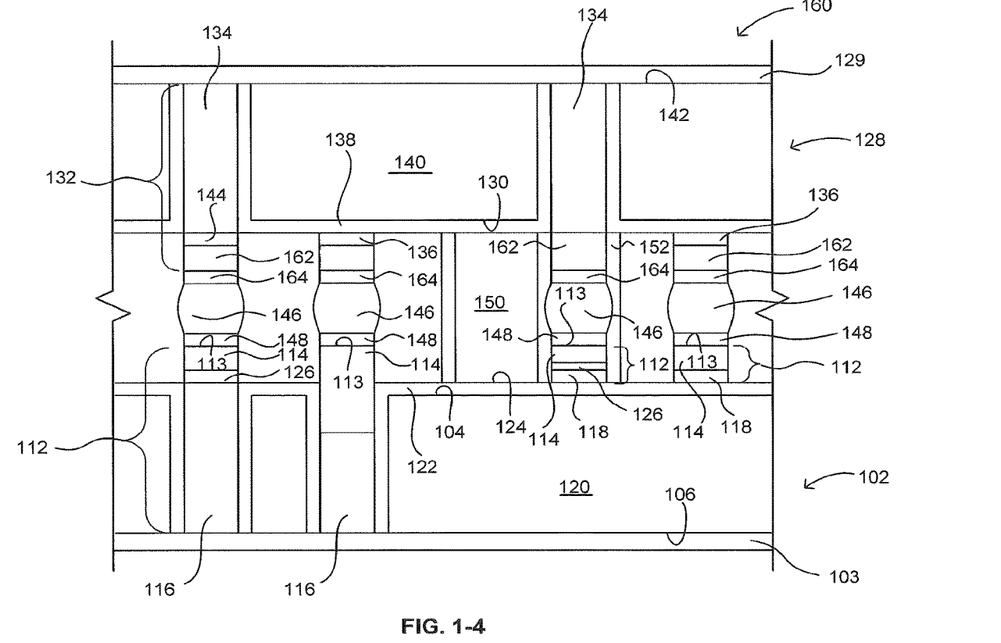
Figure 15:
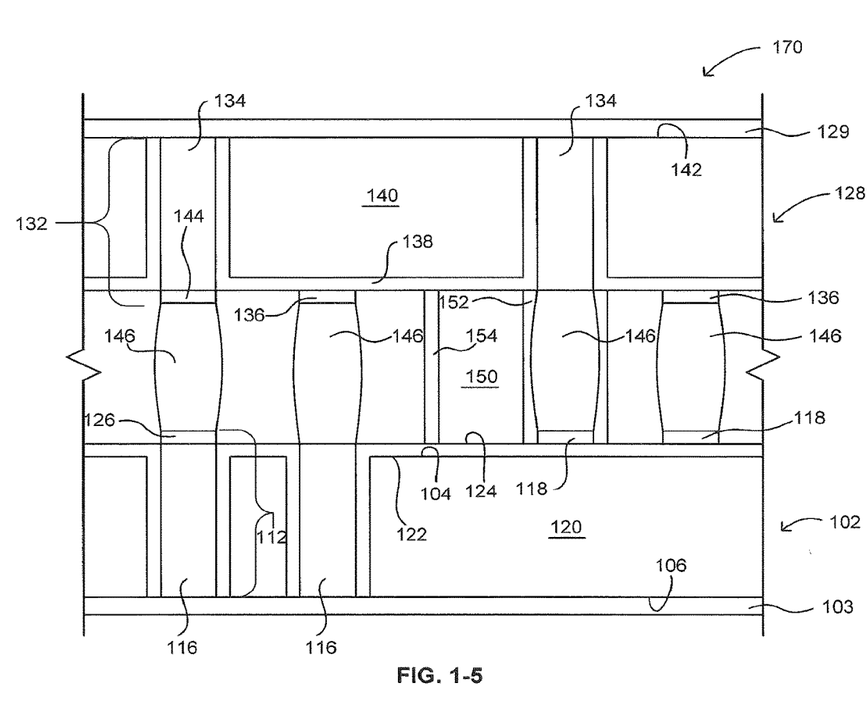
Figure 16:
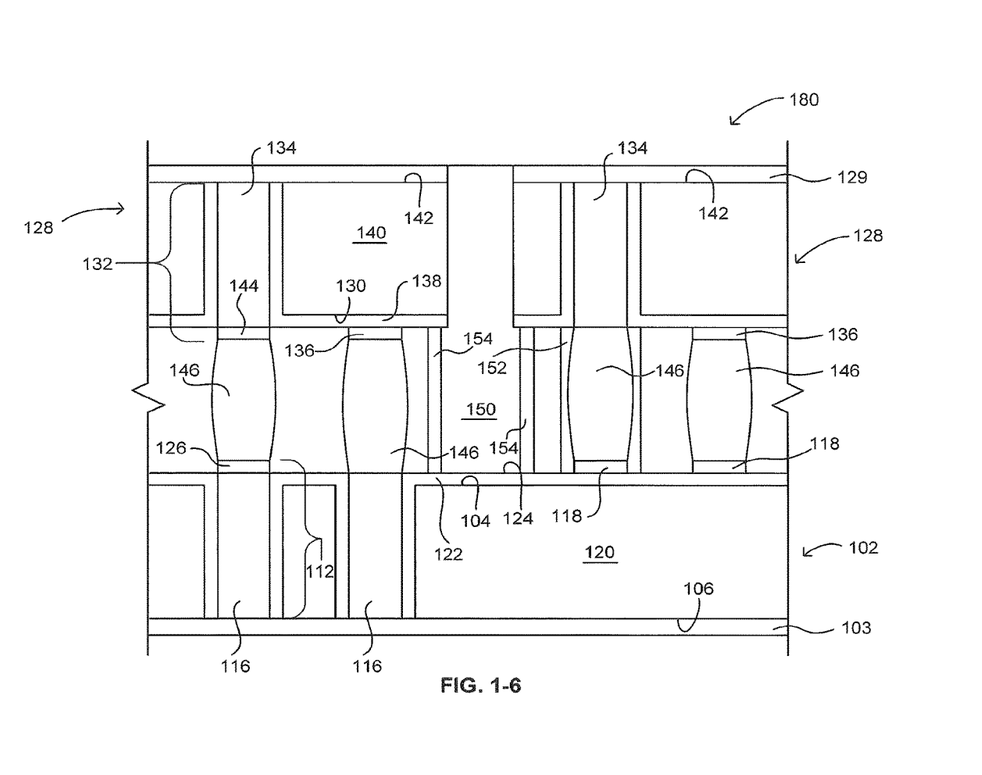

The plated metal connector regions 146 can extend continuously between the respective first surfaces 113 of the first plated metal regions and the corresponding second surfaces of the second plated metal regions 162. The plated metal connector region 146 does not fully cover portions of the sidewalls of the second plated metal regions 162, which extend above surface 130 and optional barrier layer 138. In some embodiments, a second intermetallic region 164 may form at the interface of the second plated metal regions 162 and the plated metal connector regions 146. The second intermetallic layer 164 can be constructed in a like manner as the first intermetallic region 148 discussed above. As illustrated in FIG. 1-4, the barrier regions 152 can further separate the second plated metal regions 162 from the region 150, the barrier regions 152 electrically and/or chemically isolating the second plated metal region 162 from the region 150.

FIG. 1-5 depicts a microelectronic assembly 170 in accordance with a variation of the above-described embodiment (FIGS. 1-1 through 1-4) where elements with the same reference numbers denote the same structures. As illustrated in FIG. 1-5, the first and second metal connection elements 112, 132 include vias or contacts and optionally seed layers 126, 144. However, in this variation, the first and second metal connections elements 112, 132 may not include first and second plated metal regions 114, 162 as depicted in FIG. 1-5 for embodiments of the microelectronic assembly 170. Rather, the plated metal connection regions 146 may extend continuously between respective first surfaces of first metal connection elements 112 and corresponding second surfaces of second metal connection elements 132 as illustrated in FIG. 1-5.

FIG. 1-6 depicts a microelectronic assembly 180 in accordance with a variation of the above-described embodiment (FIGS. 1-1 through 1-5) where elements with the same reference numbers denote the same structures. In this variation, more than one second component 128 can be attached to the first component 102. The elements 154 may be included for each second component 128, for example, to set the predetermined spacing between first major surfaces 104, 130 of the first and second components 104,128 and/or to attach the first and second components 104, 128 prior to formation of the region 150. The region 150 may further extend laterally between oppositely facing ends of multiple second components 128 as illustrated in FIG. 1-6. In some embodiments, the predetermined spacing between first major surfaces 104, 130 may differ among second components 128. For example, a first predetermined spacing may separate first major surfaces 104, 130 for one of the second components 128, and a second predetermined spacing may separate first major surfaces 104, 130 for another of the second components 128.

Figure 2:
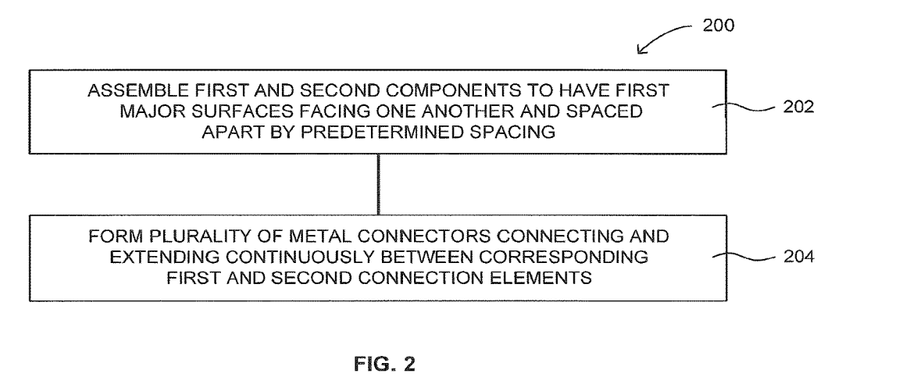
FIG. 2 depicts a flow chart for a method of forming a microelectronic assembly in accordance with some embodiments of the invention.

FIG. 2 depicts a flow chart of a method 200 for fabrication of a microelectronic assembly in accordance with some embodiments of the present invention. The method 200 is described below in accordance with the stages of fabrication of the microelectronic assemblies 160 and 170, respectively depicted in FIGS. 3-1 through 3-6, and FIGS. 4-1 through 4-4. However, the method 200 may be applied to other embodiments of the present invention, such as the microelectronic assemblies 100, 180, or other microelectronic assemblies within the scope of the invention.

FIG. 3-1 depicts the first or second component 102, 128 in accordance with some embodiments of the invention. For the purposes of description, a method of fabricating the first component 102 will be described below in accordance with FIG. 3-1 through 3-4; however, the method can be applied to the second component 128 as well. Though illustrated in FIGS. 3-1 through 3-4 as formed prior to formation of the first plated metal regions 114, the RDL structure 103 could be formed after the first plated metal regions 114 are formed.

Figure 31:
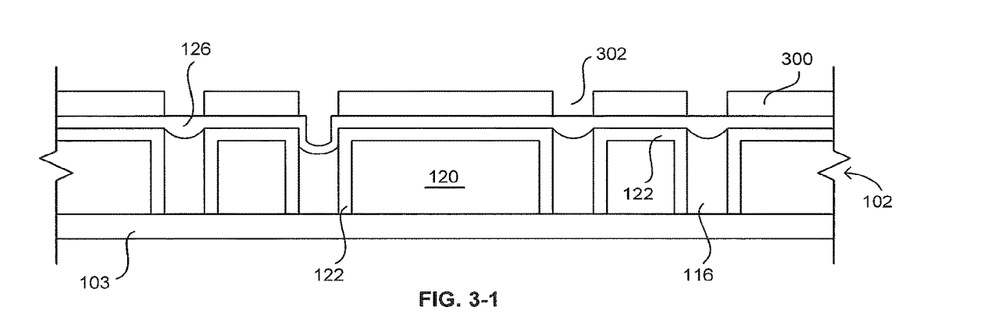

As depicted in FIG. 3-1, vias 116 may be formed in the region 120 extending in the first direction 110 of the thickness 108 between the first and second major surfaces 104, 106 of the first component 102. In other embodiments, contacts 118 may be formed in place of vias 116, or a combination of vias 116 and contacts 118 may be formed. It will be understood that the vias 116 and contacts 118 may be formed by any suitable methods known in the art. Prior to formation of the vias 116 and/or contacts 118, the barrier layer 122 may be formed to provide electrical and/or chemical isolations of the vias 116 and/or contacts 118 from the region 120 of the first component 102.

A first seed layer 126 may be formed overlying the barrier layer 122. The first seed layer 126 may conform to and overlie surfaces of the vias 116, for example, such as uneven surfaces of the vias 116 depicted in FIG. 3-1. In some embodiments, such as when the vias 116 extend between the second major surface 106 and a level below the first major surface 104, the first seed layer 126 may overlie portions of the barrier layer 122, which is oriented in the first direction 110 and overlying walls of openings in the region 120 in which the vias 116 are formed. As discussed herein, the first seed layer 126 can be an optional layer which can be used as an electrical commoning layer for one or more depositions which may include electrolytic plating.

A patterned layer 300 can be formed overlying the first seed layer 126 as depicted in FIG. 3-1, or overlying the barrier layer 122 if no seed layer is used. The patterned layer 300 can be a patterned dielectric layer or patterned resist layer. The patterned layer 300 includes openings 302 exposing portions of the first seed layer 126 overlying at least portions of the vias 116.

Figure 32:
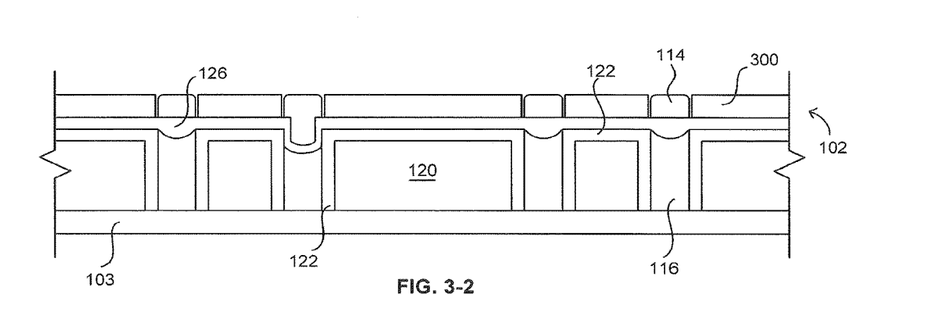

FIG. 3-2 depicts the first plated metal region 114, which may be plated in the openings 302 of the patterned layer 300. The first plated metal regions 114 may extend in the first direction 110 along the thickness of the layer 300 or onto portions of the optional seed layer 126 exposed within the openings 302 when the seed layer is present. Though depicted in FIG. 3-2 as having the same lateral thickness as the corresponding vias 116, the first plated metal regions 114 may have a different lateral thickness that the vias 116. For example, the lateral thickness of the first plated metal regions 114 can be controlled by the size of the openings 302 in the patterned layer 300. Though depicted in FIG. 3-2 as having a common axis, the first plated metal regions 114 and corresponding vias 116 can be offset. For example, the openings 302 in the patterned layer 300 may offset relative to the vias 116 to control the formation of offset first plated metal regions 114.

The first plated metal regions 114 can be formed by electrolytic or electroless plating. As mentioned above, the first seed layer 126, when present, can provide electrical commoning if the plated metal regions are formed by processing that includes electrolytic plating. In some embodiments, plating additives, such as one or more of suppressors, accelerators, levelers, or the like may be utilized in plating processes. Exemplary additives can include additives made by Enthone, Inc. of West Haven, Conn., or by Atotech, Inc. of Rock Hill, S.C. One exemplary additive produced by Atotech, Inc. that may be utilized in some embodiments of the present invention is CUPRABASE®, which can include spherolyte accelerator 10 at about 1 to about 10 milliliters per liter of solution (mL/L), spherolyte carrier 11 at about 1 to about 10 mL/L, spherolyte leveler 10 at about 2 to about 40 ml/L or the like. In some embodiments, plating additives can be used in combination with plating in high aspect ratio features, such as vias, holes, gaps, damascene structures, or the like. In some embodiments, at least some plating additives may be excluded. For example, in one embodiment, a carrier may be used without any plating additives. In one embodiment, the leveler can be omitted. In one embodiment, a plating current density between about 5 to about 60 milliamps/cm$^2$ can be used.

Figure 33:
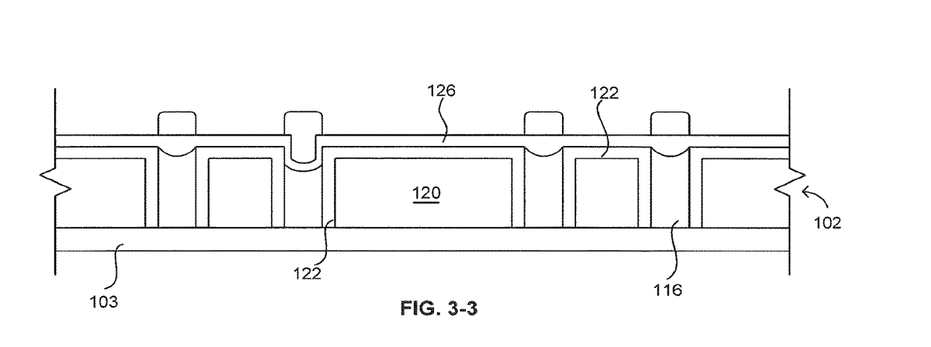

FIG. 3-3 depicts the first component 102 after the patterned layer 300 has been removed. The layer 300 may be removed by any suitable methods known in the art, such as by using a resist remover or the like. As depicted in FIG. 3-3, the first metal connection elements 112 including the vias 116, the first seed layer 126, and the first plated metal regions 114 may be electrically connected via the first seed layer 126, which overlies the barrier layer 122.

Figure 34:
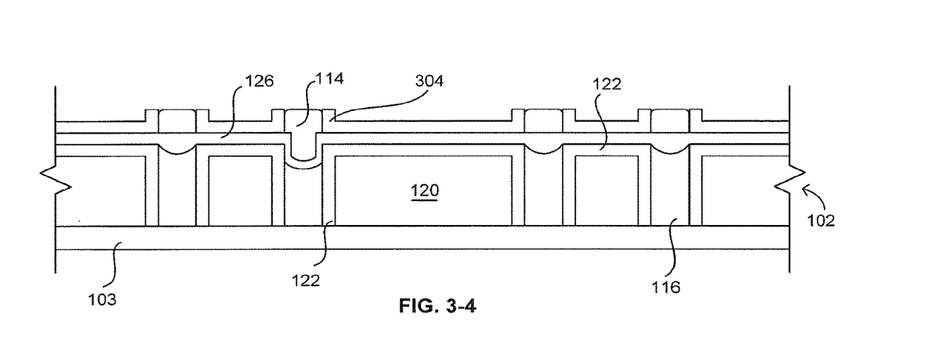

FIG. 3-4 depicts the first component 102 where a second layer 304 is formed overlying the first seed layer 126 and sidewall surfaces of the first plated metal regions 114. The second layer 304 can be a dielectric layer or a resist. At least a portion of the first surfaces 113 of the first plated metal regions 114 are not covered by the second layer 304 as depicted in FIG. 3-4.

Figure 35:
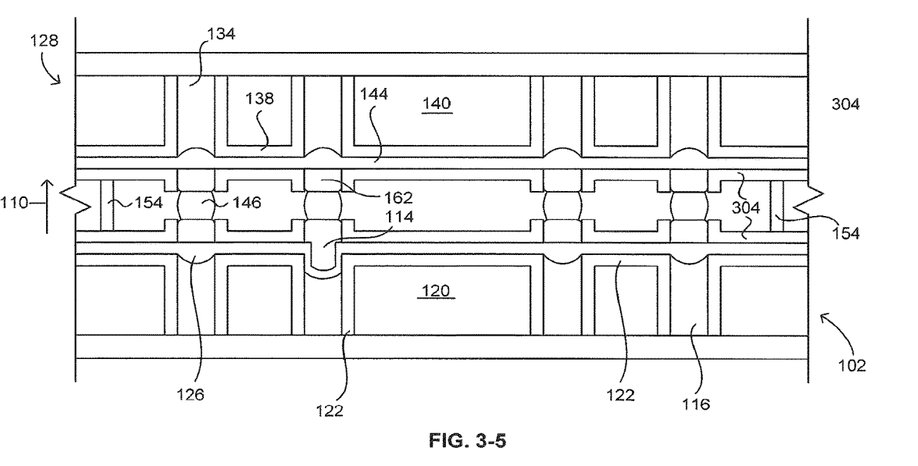

A 202, a first and second component 102, 128 having the second layer 304 as discussed above can be assembled to have the first major surfaces 104, 130 spaced apart by the predetermined spacing. As depicted in FIG. 3-5, the predetermined spacing can be determined by a thickness of the elements 154 in the first direction 110. As discussed above the elements 154 can be a dielectric adhesive and/or polymeric material that fixes the first and second components 104, 128 with respect to each other. Once fixed at the predetermined spacing, the first and second surfaces of the first and second plated metal regions 114, 162 may be spaced apart. Though depicted in FIG. 3-5 as aligned along a common axis, the first and second components can be offset such that corresponding first and second metal connection elements 112, 132 do not share a common axis in the first direction 110.

At 204, the plurality of plated metal connector regions 146 can be plated and extend continuously between the first and second surfaces of corresponding first and second plated metal regions 114, 162. The plated metal connector regions 146 can be formed by electrolytic or electroless plating processes. Again, as in the case of the plated metal regions 114, 162, the optional seed layers 126, 144 on the first and second components, respectively, can provide electrical commoning during depositions which include electrolytic plating to form the plated meal connector regions 146. In some embodiments of the plating process, temperature can range from about 40 to about 70 degrees Celsius to achieve higher deposition rate. In some embodiments, a metal content of electrolyte can be greater than about 1 mol. In some embodiments, the metal content of the electrolyte can range from about 0.2 mol to about 1 mol. In some embodiments, the plated metal connectors 146 can be plated without plating additives. For example, when plating copper or nickel, additives may be excluded because issues such as uniformity, smoothness, and the like, may not be critical issues. As a result, the cost of the process can be reduced and additive consumption or incorporation in the final structure can be avoided. By excluding plating additives, the plated metal connector regions 146 can have lower impurities than the first and second plated metal regions 114, 162.

Figure 36:
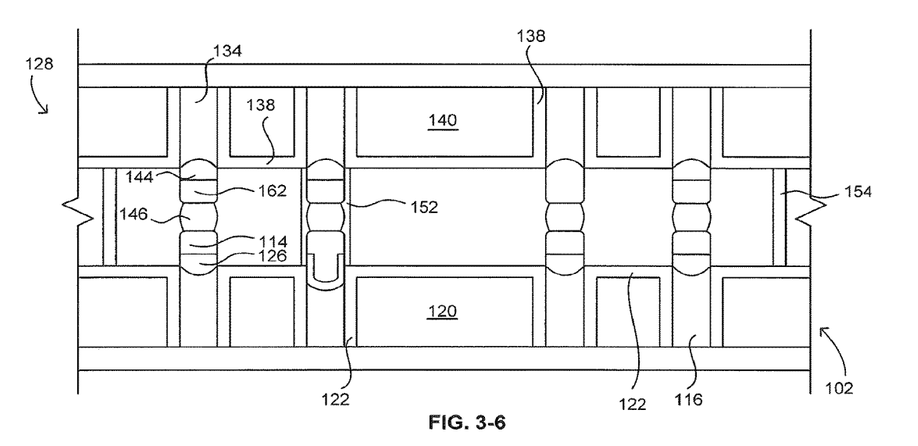
Figure 41:
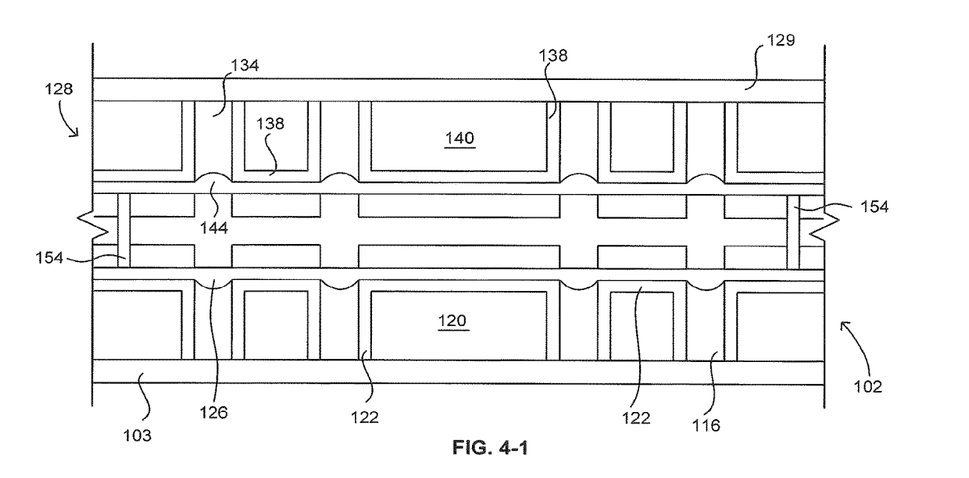

After the plated metal connector regions 146 are formed, the second dielectric layers 302 can be removed and portions of the optional first and second seed layers 126, 144, exposed thereby, if any, can be removed as depicted in FIG. 3-6. Optionally, prior to or after removal of the second dielectric layers 302 and portions of the first and second seed layers 126, 144, barrier regions 152 may be formed surrounding at least the plated metal connector region 146, or portions of the first and second plated region regions 114, 162. The barrier region 152 may be formed by an electrolytic or electroless plating process. For example, in one embodiment, where the first and second seed layers 126, 144 comprise a similar material to the plated metal connector regions 146, the barrier region 152 may be formed by electroless or electrolytic plating, where the seed layers 126, 144 can provide electrical commoning for deposition that includes electrolytic plating. In this way, the barrier region can be formed surrounding the plated metal connector region 146 as protection for the plated metal connector regions 146 for when portions of the first and second seed layers 126, 144 as subsequently removed, such as by a selective chemical etch process. In another embodiment, where the first and second seed layers 126, 144 are a different material from the plated metal connector regions 146, the barrier region 152 may not be necessary prior to removal of the second dielectric layer 302 and portions of the optional first and second seed layers 126, 144. However, the barrier region 152 may optionally be formed after removal of the second dielectric layer 302 and portions of the first and second seed layers 126, 144, such as by electroless plating, to provide electrical and/or chemical isolation of the first and second connection elements 112, 132 and plated metal regions 114, 162 from the region 150 (not depicted in FIG. 3-6). In some embodiments, the barrier region 152 can be provided as a corrosion inhibitor. For example, one embodiment where a corrosion inhibitor can be utilized is when the region 150 is air or vacuum. Exemplary corrosion inhibitors than can be utilized include benzotriazole metal complexes.

The region 150 may be formed after the barrier region 152 has been deposited or removed and/or after the second layer 304 and portions of the first and second seed layers 126, 144 have been removed. As discussed above, in some embodiments, the region 150 may be air or vacuum. Alternatively, in some embodiments, where a material is deposited to form the region 150, the material can be deposited between the first major surfaces 104, 130 by vacuum and/or pressure-assisted flow. For example, materials that may be flowed to form the region 150 may include one or more of dielectric materials, materials for underfill, or the like. The process by which the region 150 is formed may not exceed the melting temperature of the plated metal connector regions 146. For example, the temperature of the process may be up to about 200° C. In one embodiment, the temperature may range from about 150° C. to about 200° C.

Alternatively, the method 200 can be applied to first and second components 102, 128, where either the first or second plated metal region 114, 162 is formed, or where neither the first and second plated metal regions 114, 162 are formed. For example, the method 200 may be applied to a microelectronic assembly formed from a component as depicted in FIG. 3-1 and another component as depicted in FIG. 3-4. In some embodiments, the method 200 may be applied to two components as depicted in FIG. 3-1 as described below in accordance with FIGS. 4-1 through 4-4.

FIGS. 4-1 through 4-4 depict steps of fabricating a microelectronic assembly in accordance with some embodiments of the invention. As depicted in FIG. 4-1, the method 200 can include assembling the first and second components 102, 128, where the first and second components 102, 128 may include the first and second seed layers 126, 144 respectively, and patterned layers 300 overlying each seed layer 126, 144. The elements 154 may have a thickness extending in the first direction 110 between the first major surfaces 104, 130 as depicted in FIG. 4-1. Alternatively, the elements 154 may have a thickness extending in the first direction 110 between the opposing surfaces of each patterned layer 300.

Figure 42:
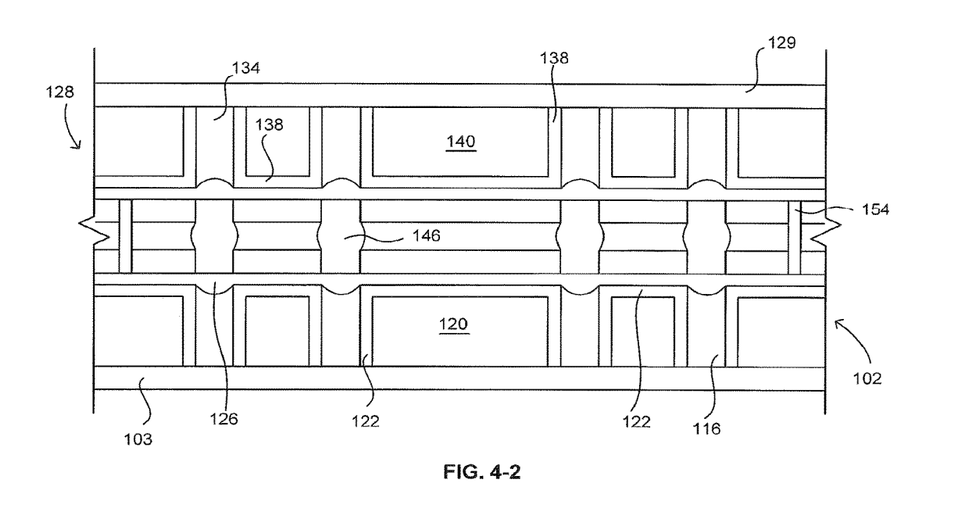
Figure 43:
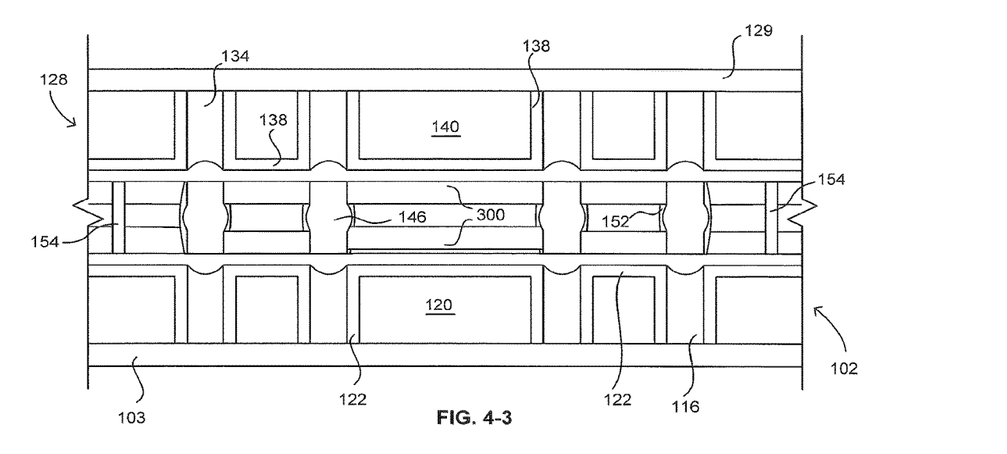

The plurality of plated metal connector regions 146 may be formed extending continuously between the portions of the first and second seed layers 126, 144 exposed through the openings in the patterned layers 300. The barrier layer 152 could be applied to a region of the plated metal connector regions 146 exposed between the patterned layers 300. For example, the barrier layer 152 may protect the plated metal connector regions 146 from exposure, erosion, or attack during removal of the patterned layers 300. Alternatively, when using a material for the plated metal connector regions 146 that is robust with respect to removal of the patterned layers 300, the barrier layer 152 may be formed after removal of the layers 300. In yet another alternative embodiment, the barrier layer 152 may not be formed at all. For example, the plated metal connector regions 146 may be inert to and/or of sufficient lateral thickness to withstand removal of the patterned dielectric layer 300 as well as removal of the first and second seed layers 126, 144. However, in some embodiments, the barrier layers 152 could be applied after removal of the dielectric layers 300 and seed layers 126, 144 to electrically and/or chemically insulate the plated metal connector regions 146 from the region 150.

Figure 44:
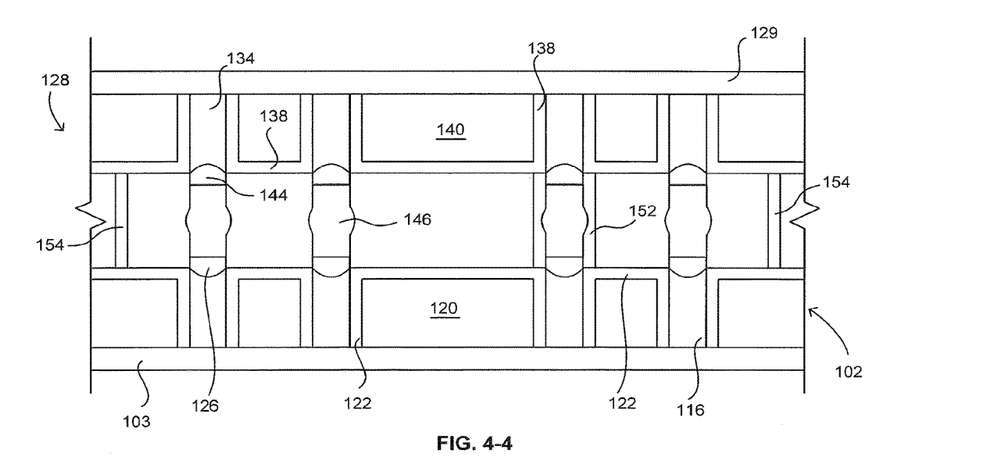

FIG. 4-4 depicts the microelectronic assembly after the dielectric layers 300 and portions of the seed layers 126, 144 between adjacent plate metal connector regions 146 have been removed. In some embodiments, the barrier layers 152 can be formed overlying the plated metal connector regions 146 prior to forming the region 150. In some embodiments, the elements 154 can be removed prior to forming the region 150.

Though depicted in FIGS. 3-1 through 3-6 and 4-1 through 4-4 as having first and second seed layers 126, 144, in some embodiments, only one seed layer 126, 144 may be required to connect corresponding first and second connection elements 116, 132 In some embodiments, only one seed layer 126, 144 may be required to connect corresponding first and second metal connection elements 112, 132. For example, in some embodiments, both seed layers 126, 144 can be used to shorten processing time.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly, comprising:
   a first component having first and second oppositely-facing major surfaces, a first thickness extending in a first direction between the first and second major surfaces, and a plurality of first metal connection elements at the first major surface;
   a second component having a first major surface and a plurality of second metal connection elements at the first major surface of the second component,
   the first major surfaces of the first and second components facing one another;
   a plurality of plated metal connectors each connecting and extending continuously in the first direction between a respective first metal connection element and a corresponding second metal connection element opposite the respective first metal connection element; and
   a plurality of metallic barrier layers overlying continuously at least some of the plated metal connectors and the first and second metal connection elements in the first direction, each barrier chemically insulating a corresponding plated metal connector.

2. The assembly according to claim 1, wherein the first component and the plated metal connector are non-electrical non-thermal components for mechanical support.

* * * * *